(12) United States Patent
Yamazaki (10) Patent No.: US 9,136,806 B2
(45) Date of Patent: Sep. 15, 2015

(54) AMPLIFIER CIRCUIT

(71) Applicant: CANON KABUSHIKI KAISHA, Tokyo (JP)

(72) Inventor: Yoshikazu Yamazaki, Sagamihara (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 112 days.

(21) Appl. No.: 14/035,554

(22) Filed: Sep. 24, 2013

(65) Prior Publication Data

US 2014/0104001 A1    Apr. 17, 2014

(30) Foreign Application Priority Data

Oct. 11, 2012 (JP) ................................ 2012-226327

(51) Int. Cl.
*H03F 3/45* (2006.01)

(52) U.S. Cl.
CPC ........ *H03F 3/45071* (2013.01); *H03F 3/45192* (2013.01); *H03F 3/45475* (2013.01); *H03F 2203/45528* (2013.01); *H03F 2203/45534* (2013.01)

(58) Field of Classification Search
USPC ........................................... 330/255, 51, 262
IPC .......................................................... H03F 3/45
See application file for complete search history.

(56) References Cited

U.S. PATENT DOCUMENTS

| | | | | |
|---|---|---|---|---|
| 4,616,189 | A * | 10/1986 | Pengue, Jr. | 330/253 |
| 5,838,722 | A * | 11/1998 | Consi | 375/219 |
| 5,949,284 | A * | 9/1999 | Frisch | 330/253 |
| 7,521,971 | B2 | 4/2009 | Yamazaki | |
| 7,906,998 | B2 | 3/2011 | Yamazaki | |
| 8,085,098 | B2 | 12/2011 | Yamazaki | |
| 8,334,713 | B2 | 12/2012 | Yamazaki | |
| 8,456,231 | B2 | 6/2013 | Yamazaki | |
| 8,531,239 | B2 | 9/2013 | Yamazaki | |
| 2009/0273397 | A1* | 11/2009 | Bockelman et al. | 330/51 |
| 2010/0090766 | A1* | 4/2010 | Boucher | 330/264 |
| 2012/0045076 | A1* | 2/2012 | Gonano et al. | 381/120 |
| 2013/0057343 | A1* | 3/2013 | Kondo | 330/252 |
| 2013/0119244 | A1 | 5/2013 | Shibata et al. | |

FOREIGN PATENT DOCUMENTS

| | | |
|---|---|---|
| JP | 64-72607 A | 3/1989 |
| JP | 5-226948 A | 9/1993 |

* cited by examiner

*Primary Examiner* — Patricia T Nguyen
(74) *Attorney, Agent, or Firm* — Fitzpatrick, Cella, Harper & Scinto (57) ABSTRACT

An amplifier circuit includes a differential amplifier circuit configured to amplify a voltage between a signal input to a first input terminal and a signal input to a second input terminal, a plurality of output circuits each configured to output a signal corresponding to a signal output from the differential amplifier circuit, and a control circuit configured to set a selected one of the plurality of output circuits in an operating state to drive an output terminal of the selected output circuit, and set a remaining output circuit in a non-operating state and set an output terminal of the remaining output circuit in a high impedance state.

8 Claims, 9 Drawing Sheets

AMPLIFIER CIRCUIT

BACKGROUND OF THE INVENTION

1. Field of the Invention

The present invention relates to an amplifier circuit.

2. Description of the Related Art

Japanese Patent Laid-Open No. 5-226948 discloses a multiple output amplifier including a constant current source, an amplifier input stage, a level shift stage, and a plurality of output circuits. In this multiple output amplifier, the plurality of output circuits share the constant current source, amplifier input stage, and level shift stage, thereby suppressing an increase in chip area.

The multiple output amplifier disclosed in Japanese Patent Laid-Open No. 5-226948 does not stop the operation of an output circuit not in use. When a load is connected to the output circuit not in use, the output circuit not in use may adversely affect an output circuit in use in a way such as a crosstalk. In addition, power is consumed by a bias current for operating the output circuit not in use.

SUMMARY OF THE INVENTION

The present invention provides a technique advantageous in the reduction of a crosstalk and/or power consumption.

One of aspects of the present invention provides an amplifier circuit comprising: a differential amplifier circuit configured to amplify a voltage between a signal input to a first input terminal and a signal input to a second input terminal; a plurality of output circuits each configured to output a signal corresponding to a signal output from the differential amplifier circuit; and a control circuit configured to set a selected one of the plurality of output circuits in an operating state to drive an output terminal of the selected output circuit, and set a remaining output circuit in a non-operating state and set an output terminal of the remaining output circuit in a high impedance state.

Further features of the present invention will become apparent from the following description of exemplary embodiments (with reference to the attached drawings).

DESCRIPTION OF THE EMBODIMENTS

Preferred embodiments of the present invention will now be described in detail in accordance with the accompanying drawings. Note that for the sake of descriptive convenience, terminals and signals corresponding to the terminals are denoted by the same names in the following description and accompanying drawings.

Figure 1:
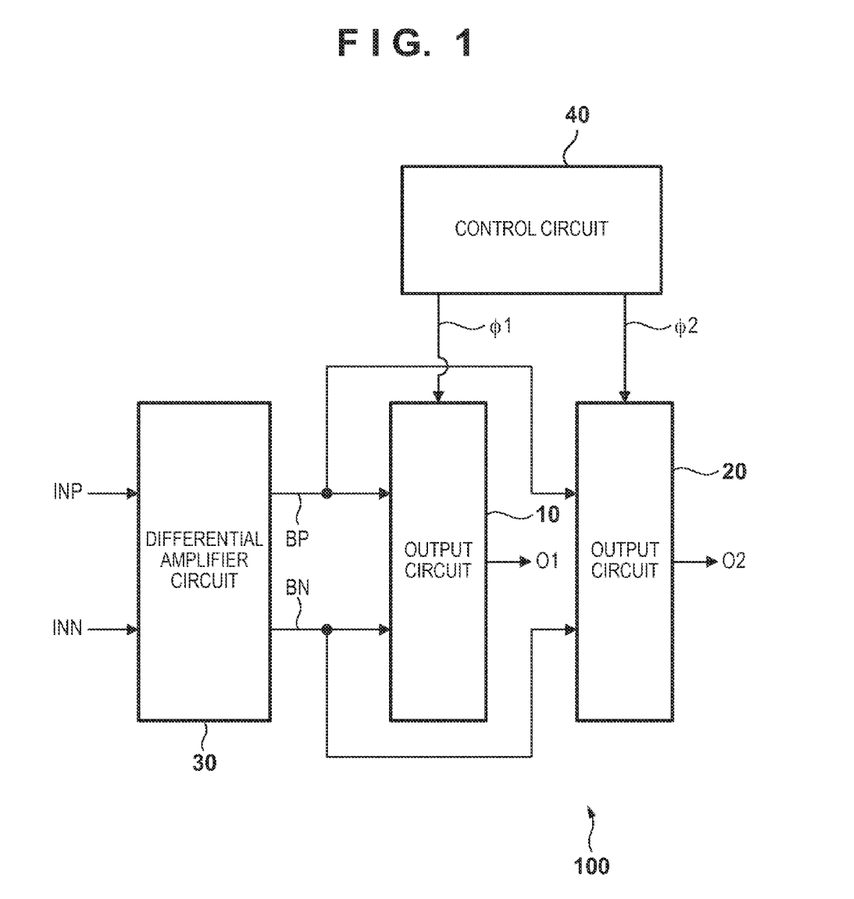
FIG. 1 is a block diagram showing the arrangement of an amplifier circuit according to the first embodiment.

FIG. 1 shows the arrangement of an amplifier circuit 100 according to the first embodiment of the present invention. The amplifier circuit 100 is arranged as a differential amplifier having a plurality of output terminals O1 and O2. The amplifier circuit 100 outputs, from the selected one of the plurality of output terminals O1 and O2, a signal obtained by amplifying a voltage between a signal INP input to a non-inverting input terminal (first input terminal) INP and a signal INN input to an inverting input terminal (second input terminal) INN. The amplifier circuit 100 includes a differential amplifier circuit 30, a plurality of output circuits 10 and 20, and a control circuit 40.

The differential amplifier circuit 30 amplifies the signal INP input to the non-inverting input terminal (first input terminal) INP and the signal INN input to the inverting input terminal (second input terminal) INN and outputs drive signals BP and BN. The drive signals BP and BN are signals to drive the plurality of output circuits 10 and 20. The plurality of output circuits 10 and 20 output signals corresponding to the drive signals BP and BN output from the differential amplifier circuit 30. Note that the output circuit 10 outputs the signal O1 corresponding to the drive signals BP and BN from the output terminal O1, and the output circuit 20 outputs the signal O2 corresponding to the drive signals BP and BN from the output terminal O2.

The control circuit 40 sets the selected one of the plurality of output circuits 10 and 20 in an operating state to drive the output terminal of the selected output circuit. The control circuit 40 sets an output circuit (non-selected output circuit) other than the selected one of the plurality of output circuits 10 and 20 in a non-operating state and sets the output terminal of the non-selected output circuit in a high impedance state. The output terminal of the selected one of the plurality of output circuits 10 and 20 is set in a low impedance state. When the non-selected output circuit is set in a non-operating state, and the output terminal of the non-selected output circuit is set in the high impedance state, thereby reducing the power consumption. In addition, this makes it possible to reduce the influence of the crosstalk on the selected output circuit from the non-selected output circuit.

The control circuit 40 controls the output circuit in the operating state and the output circuit in the non-operating state out of the plurality of output circuits 10 and 20 in accordance with control signals φ1 and φ2. In this case, the number of output circuits may be three or more. The control circuit 40 can set all or some of the plurality of output circuits in a selected state. When some of the plurality of output circuits are to be set in the selected state, the control circuit sets the remaining output circuits in the non-selected state.

The control circuit 40 can set all the plurality of output circuits 10 and 20 in the non-operating state and at the same time sets the output terminals of the non-selected output circuits in the high impedance state. For example, in a standby state (for example, a state in which signals are not input to the input terminals INP and INN), the control circuit 40 preferably sets all the plurality of output circuits 10 and 20 in the non-operating state and at the same time sets their output terminals in the high impedance state. With this control, the power consumption can be suppressed.

Figure 2:
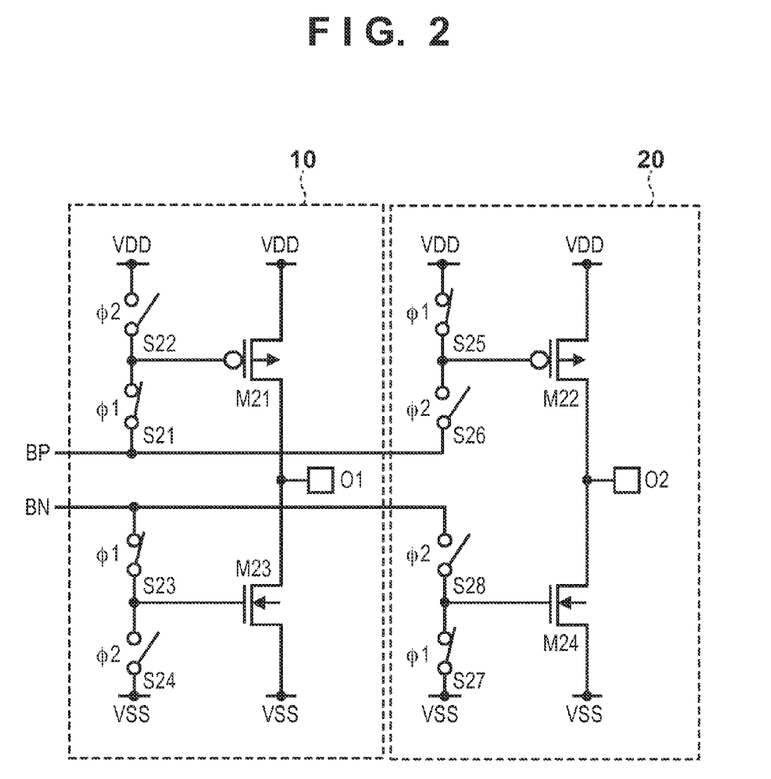
FIG. 2 is a circuit diagram showing the first arrangement example of a plurality of output circuits in the amplifier circuit of the first embodiment.

FIG. 2 shows the first arrangement example of the plurality of output circuits 10 and 20 in the amplifier circuit 100 of the first embodiment. The output circuit 10 includes switches S21, S22, S23, and S24, PMOS transistor M21, and NMOS transistor M23. The PMOS transistor M21 and the NMOS transistor M23 serve as driving elements for driving the output terminal O1. The drain terminal of the PMOS transistor M21 and the drain terminal of the NMOS transistor M23 are connected to the output terminal O1 of the output circuit 10. The source terminal of the PMOS transistor M21 receives a power supply voltage VDD, and the source terminal of the NMOS transistor M23 receives a reference voltage VSS.

The switch S21 is connected between the gate terminal of the PMOS transistor M21 and the node which receives the drive signal BP. The switch S23 is connected to the gate terminal of the NMOS transistor M23 and the node which receives the drive signal BN. The ON/OFF operations of the switches S21 and S23 are controlled in accordance with the control signal φ1. The switch S22 is connected between the gate terminal of the PMOS transistor M21 and the power supply voltage VDD. The switch S24 is connected between the gate terminal of the NMOS transistor M23 and the reference voltage VSS. The ON/OFF operations of the switches S22 and S24 are controlled in accordance with the control signal φ2.

The output circuit 20 includes switches S25, S26, S27, and S28, PMOS transistor M22, and NMOS transistor M24. The drain terminal of the PMOS transistor M22 and the drain terminal of the NMOS transistor M24 are connected to the output terminal O2 of the output circuit 20. The source terminal of the PMOS transistor M22 receives the power supply voltage VDD, and the source terminal of the NMOS transistor M24 receives the reference voltage VSS. The PMOS transistor M22 and the NMOS transistor M24 serve as driving elements for driving the output terminal O2.

The switch S25 is connected between the gate terminal of the PMOS transistor M22 and the power supply voltage VDD. The switch S27 is connected between the gate terminal of the NMOS transistor M24 and the reference voltage VSS. The ON/OFF operations of the switches S25 and S27 are controlled in accordance with the control signal φ1. The switch S26 is connected between the gate terminal of the PMOS transistor M22 and the node which receives the drive signal BP. The switch S28 is connected between the gate terminal of the NMOS transistor M24 and the node which receives the drive signal BN. The ON/OFF operations of the switches S26 and S28 are controlled in accordance with the control signal φ2.

With the above arrangement example, when the control signals supplied to the switches S21 to S28 are set at high level, the switches S21 to S28 are turned on in a conductive state. When the control signals supplied to the switches are set at low level, the switches S21 to S28 are turned off in a non-conductive state. The above arrangement example includes the two output circuits 10 and 20, and the operating states of these circuits are exclusively controlled. In this arrangement example, the control signals φ1 and φ2 are controlled to be exclusively set at high level. Note that the present invention is applicable to broader control, that is, control in which the selected one of the plurality of output circuits is set in the operating state, and the remaining circuit (non-selected output circuit) is set in the non-operating state.

In the above arrangement example, when the control signal φ1 is set at high level, the control signal φ2 is set at low level. In this case, the switches S21, S23, S25, and S27 are set in the conductive state, while the switches S22, S24, S26, and S28 are set in the non-conductive state. This makes it possible to supply the drive signal BP to the gate terminal of the PMOS transistor M21, and the drive signal BN to the gate terminal of the NMOS transistor M23, thereby driving the output terminal O1 in the low impedance state. To the contrary, the gate terminal of the PMOS transistor M22 receives the power supply voltage VDD, so that the PMOS transistor M22 is turned on. The gate terminal of the NMOS transistor M24 receives the reference voltage VSS, so that the NMOS transistor M24 is turned off. The output terminal O2 of the output circuit 20 is set in the high impedance state. The output circuit 20 is controlled in the non-operating state.

Similarly, when the control signal φ2 is set at high level, the control signal φ1 is set at low level. The output terminal O2 is driven with the low impedance. At this time, the output terminal O1 is controlled in the high impedance state, and the output circuit 10 is controlled in the non-operating state.

Figure 3:
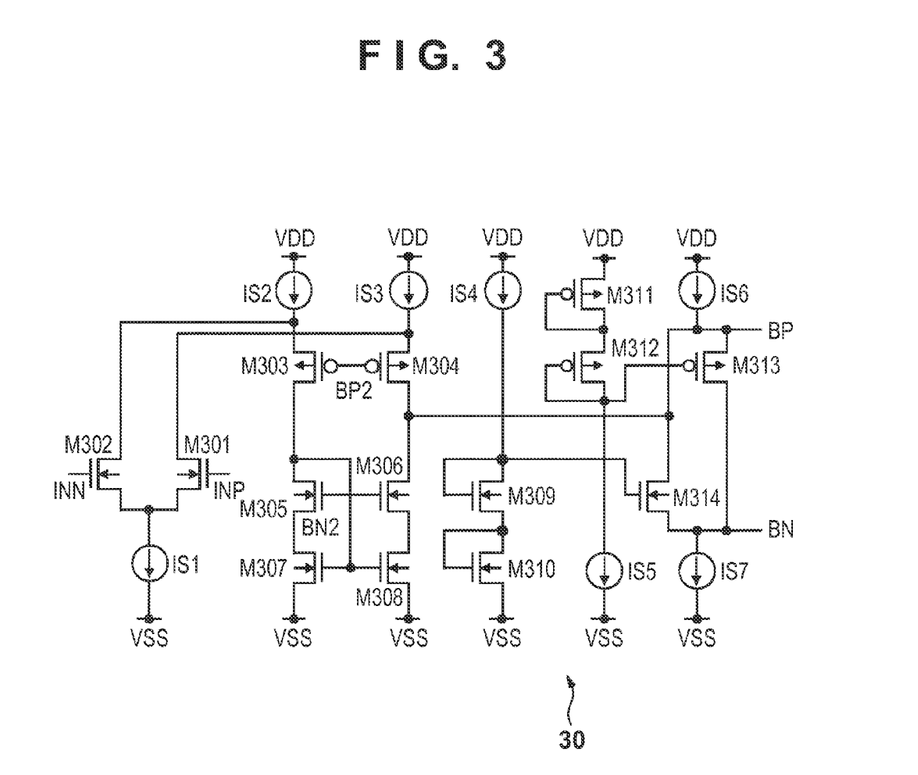
FIG. 3 is a circuit diagram showing the arrangement example of a differential amplifier circuit in the amplifier circuit of the first embodiment.

FIG. 3 shows the arrangement example of the differential amplifier circuit 30 in the amplifier circuit 100 of the first embodiment. The non-inverting input terminal (first input terminal) INP is connected to the gate terminal of an NMOS transistor M301, and the inverting input terminal (second input terminal) INN is connected to the gate terminal of an NMOS transistor M302. The NMOS transistors M301 and M302 form a differential input circuit. This differential input circuit is driven by a constant current source IS1. Constant current sources IS2 and IS3, PMOS transistors M303 and M304, the gate terminals of which receive a bias voltage BP2, and the NMOS transistors M301 and M302 form a current operation circuit for calculating a current corresponding to the differential input voltage (a voltage between INP and INN). NMOS transistors M305 and M306, the gate terminals of which receive a bias voltage BN2, and NMOS transistors M307 and M308, the gate terminals of which are connected to the drain terminal of the NMOS transistor M305 form a current mirror circuit. The differential input circuit, the current operation circuit, and the current mirror circuit form a folded cascade differential amplifier circuit.

Constant current sources IS4 and IS7, NMOS transistors M309, M310, and M314, and the NMOS transistors M23 and M24 of the output circuits 10 and 20 shown in FIG. 2 set the values of currents flowing through the output circuits 10 and 20. Similarly, constant current sources IS5 and IS6, PMOS transistors M311, M312, and M313, and the PMOS transistors M21 and M22 of the output circuits 10 and 20 shown in FIG. 2 set the values of currents flowing through the output circuits 10 and 20. The differential amplifier circuit 30 shown in FIG. 3 is connected to the circuit shown in FIG. 2 to form a differential amplifier having a class-AB output.

Figure 4:
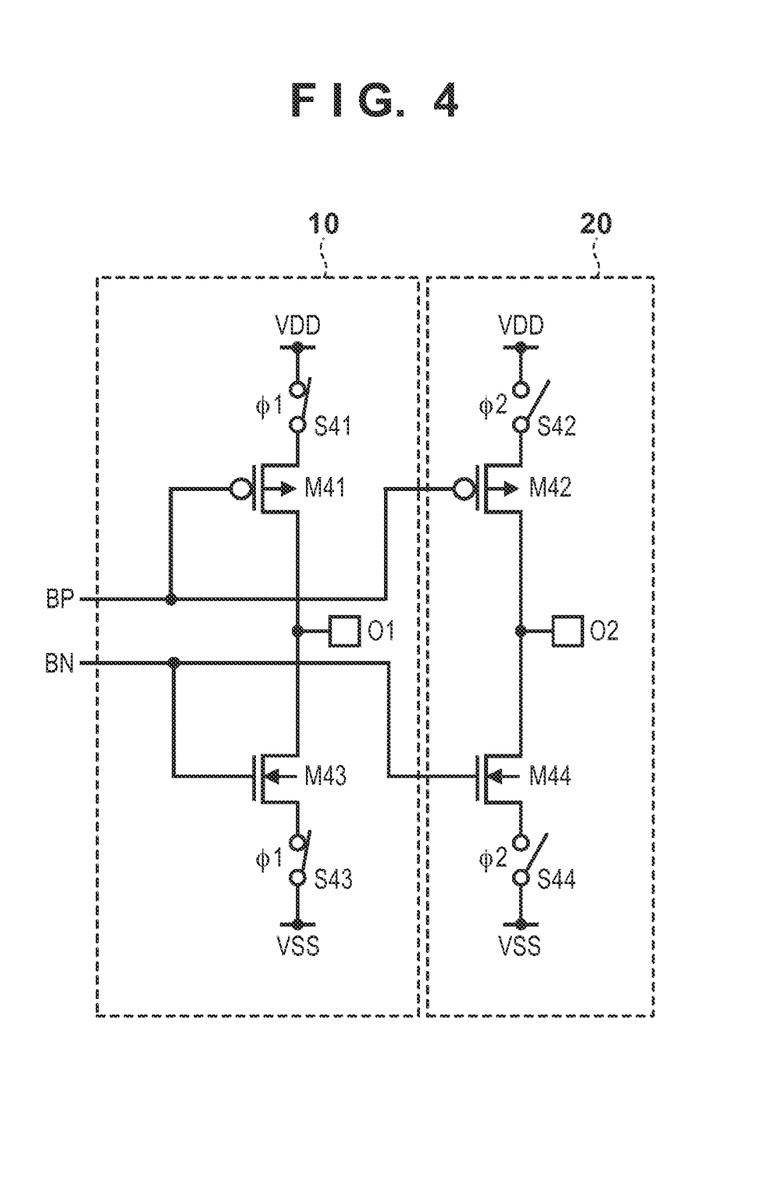
FIG. 4 is a circuit diagram showing the second arrangement example of a plurality of output circuits in the amplifier circuit of the first embodiment.

FIG. 4 shows the second arrangement example of the plurality of output circuits 10 and 20 of the amplifier circuit 100 of the first embodiment. The output circuit 10 includes switches S41 and S43, a PMOS transistor M41, and an NMOS transistor M43. The drain terminal of the PMOS transistor M41 and the drain terminal of the NMOS transistor M43 are connected to the output terminal O1. The gate terminal of the PMOS transistor M41 receives the drive signal BP. The gate terminal of the NMOD transistor M43 receives the drive signal BN. The switch S41 is connected between the source terminal of the PMOS transistor M41 and the power supply voltage VDD. The switch S43 is connected between the source terminal of the NMOS transistor M43 and the reference voltage VSS. The ON/OFF operations of the switches S41 and S43 are controlled in accordance with the control signal φ1.

The output circuit 20 includes switches S42 and S44, a PMOS transistor M42, and an NMOS transistor M44. The drain terminal of the PMOS transistor M42 and the drain terminal of the NMOS transistor M44 are connected to the output terminal O2. The gate terminal of the PMOS transistor M42 receives the drive signal BP. The gate terminal of the NMOS transistor M44 receives the drive signal BN. The switch S42 is connected between the source terminal of the PMOS transistor M42 and the power supply voltage VDD. The switch S44 is connected between the source terminal of the NMOS transistor M44 and the reference voltage VSS. The ON/OFF operations of the switches S42 and S44 are controlled in accordance with the control signal φ2.

When the control signal φ1 is set at high level, the control signal φ2 is set at low level. At this time, the source terminal of the PMOS transistor M41 is set at the power supply voltage VDD, and the source terminal of the NMOS transistor M43 is set at the reference voltage VSS, thereby driving the output terminal O1 with the low impedance. To the contrary, when the voltages at the source terminals of the PMOS transistor M42 and the NMOS transistor M44 are indefinite, the output terminal O2 is controlled in the high impedance state. The output circuit 20 is controlled in the non-operating state.

Similarly, when the control signal φ2 is set at high level, the control signal φ1 is set at low level. The output terminal O2 is driven with the low impedance, and the output terminal O1 is controlled in the high impedance state.

Figure 5A:
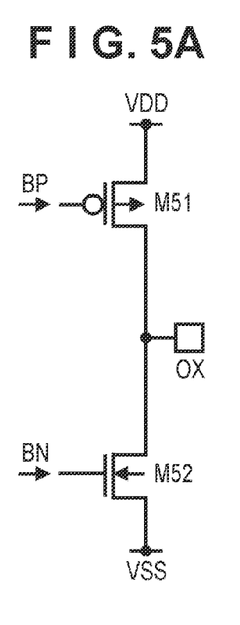
FIGS. 5A to 5D are circuit diagrams showing the third arrangement examples of a plurality of output circuits in the amplifier circuit of the first embodiment.

FIGS. 5A to 5D show the third arrangement examples of the plurality of output circuits 10 and 20 in the amplifier circuit 100 of the first embodiment. Each of the output circuits 10 and 20 has any one of the arrangements shown in FIGS. 5A to 5D. In the example of FIG. 5A, the drain terminal of a PMOS transistor M51 and the drain terminal of an NMOS transistor M52 are connected to an output terminal OX. The source terminal of the PMOS transistor M51 receives the power supply voltage VDD, and the source terminal of the NMOS transistor M52 receives the reference voltage VSS. The control circuit 40 supplies the drive voltage BP or a voltage for turning off the PMOS transistor M51 to the gate terminal of the PMOS transistor M51. Similarly, the control circuit 40 supplies the drive voltage BN or a voltage for turning off the NMOS transistor M52 to the gate terminal of the NMOS transistor M52. A case in which the output terminal OX is driven with the low impedance will be exemplified. In the first example, both the PMOS transistor M51 and the NMOS transistor M52 are used as grounded source circuits. In the second example, the PMOS transistor M51 is used as a grounded source circuit, while the NMOS transistor M52 is used as a constant current source. In the third example, the NMOS transistor M52 is used as a grounded source circuit, while the PMOS transistor M51 is used as a constant current source.

Figure 5B:
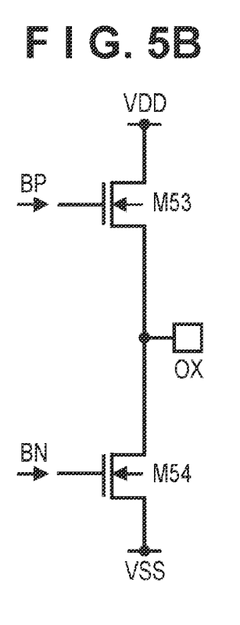

In the example shown in FIG. 5B, the source terminal of an NMOS transistor M53 and the drain terminal of an NMOS transistor M54 are connected to an output terminal OX. The drain terminal of the NMOS transistor M53 receives the power supply voltage VDD, and the source terminal of the NMOS transistor M54 receives the reference voltage VSS. The control circuit 40 supplies the drive voltage BP or a voltage for turning off the NMOS transistor M53 to the gate terminal of the NMOS transistor M53. The control circuit 40 supplies the drive voltage BN or a voltage for turning off the NMOD transistor M54 to the gate terminal of the NMOS transistor M54. As an example in which the output terminal OX is driven with the low impedance, for example, the NMOS transistor M53 is used as a source follower circuit, while the NMOS transistor M54 is used as a constant current source.

Figure 5C:
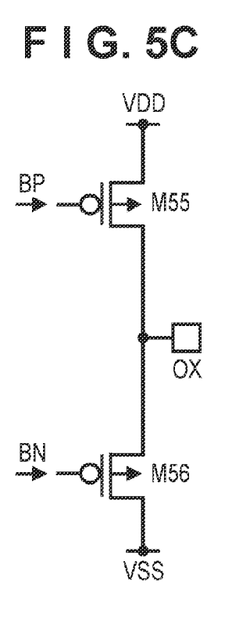

In the example shown in FIG. 5C, the drain terminal of a PMOS transistor M55 and the source terminal of a PMOS transistor M56 are connected to an output terminal OX. The source terminal of the PMOS transistor M55 receives the power supply voltage VDD. The drain terminal of the PMOS transistor M56 receives the reference voltage VSS. The control circuit 40 supplies the drive voltage BP or a voltage for turning off the PMOS transistor M55 to the gate of the PMOS transistor M55. The control circuit 40 supplies the drive voltage BN or a voltage for turning off the PMOS transistor M56 to the gate terminal of the PMOS transistor M56. As an example in which the output terminal OX is driven with the low impedance, for example, the PMOS transistor M55 is used as a constant current source, while the PMOS transistor M56 is used as a source follower circuit.

Figure 5D:
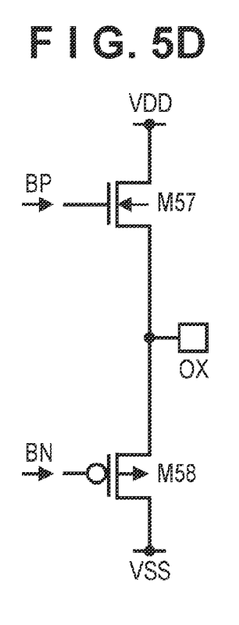

In the example shown in FIG. 5D, the source terminal of an NMOS transistor M57 and the source terminal of a PMOS transistor M58 are connected to an output terminal OX. The drain terminal of the NMOS transistor M57 receives the power supply voltage VDD. The drain terminal of the PMOS transistor M58 receives the reference voltage VSS. The control circuit 40 supplies the drive voltage BP or a voltage for turning off the NMOS transistor M57 to the gate terminal of the NMOS transistor M57. The control circuit 40 supplies the drive voltage BN or a voltage for turning off the PMOS transistor M58 to the gate terminal of the PMOS transistor M58. As an example in which the output terminal OX is driven with the low impedance, for example, both the NMOS transistor M57 and the PMOS transistor M58 are used as source follower circuits.

The circuit arrangements of the plurality of output terminals 10 and 20 are not limited to the above examples, but can employ various other arrangements. Alternatively, the plurality of output circuits 10 and 20 may have the same circuit arrangement or different circuit arrangements. In the combination of the circuit arrangements shown in FIGS. 5A and 5B, the NMOS transistors M52 and M54 can be used as constant current sources, the PMOS transistor M51 can serve as a grounded source circuit, and the NMOS transistor M53 can serve as a source follower circuit. A common drive signal need not be supplied to the output circuits 10 and 20. In FIGS. 5A to 5D, each constant current source is formed from one MOS transistor. However, the constant current source may be formed from a plurality of MOS transistors like a cascode-connected constant current source circuit.

Figure 6:
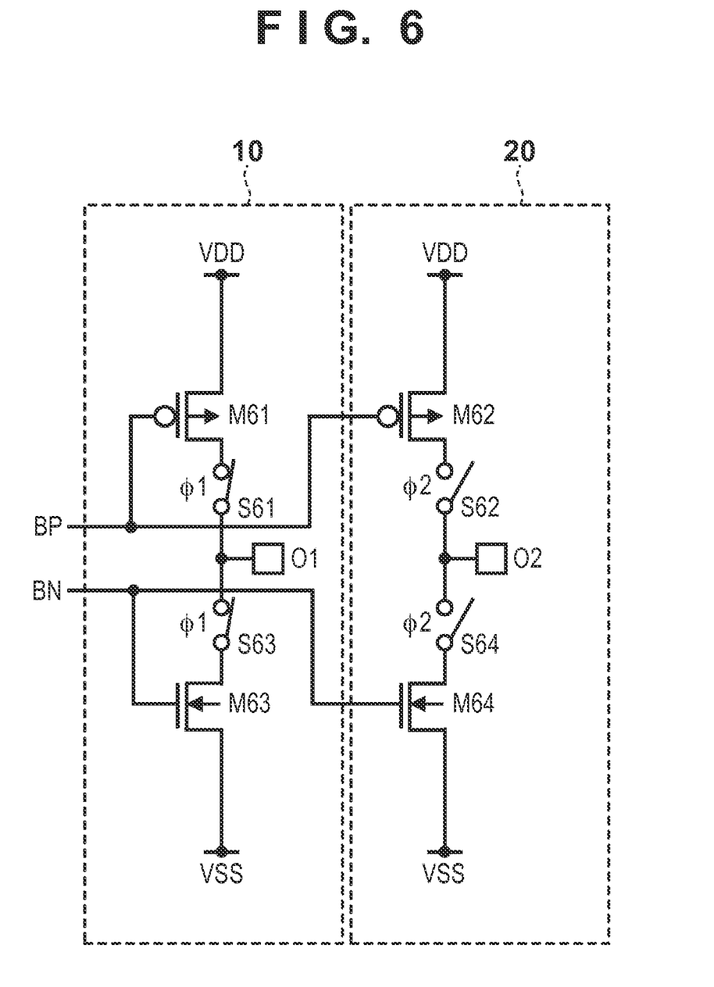
FIG. 6 is a circuit diagram showing the fourth arrangement example of a plurality of output circuits in the amplifier circuit of the first embodiment.

FIG. 6 shows the fourth arrangement example of the plurality of output circuits 10 and 20 in the amplifier circuit 100 of the first embodiment. The output circuit 10 includes switches S61 and S63, a PMOS transistor M61, and an NMOS transistor M63. The switches S61 and S63 are connected to the output terminal O1. The ON/OFF operations of the switches S61 and S63 are controlled in accordance with the control signal φ1. The drain terminal of the PMOS transistor M61 is connected to the other end of the switch S61. The source terminal of the PMOS transistor M61 receives the power supply voltage VDD. The gate terminal of the PMOS transistor M61 receives the drive signal BP. The drain terminal of the NMOS transistor M63 is connected to the other end of the switch S63. The source terminal of the NMOS transistor M63 receives the reference voltage VSS. The gate terminal of the NMOS transistor M63 receives the drive signal BN.

The output circuit 20 includes switches S62 and S64, a PMOS transistor M62, and an NMOS transistor M64. The switches S62 and S64 are connected to the output terminal O2. The ON/OFF operations of the switches S62 and S64 are controlled in accordance with the control signal φ2. The drain terminal of the PMOS transistor M62 is connected to the other end of the switch S62. The source terminal of the PMOS transistor M62 receives the power supply voltage VDD. The gate terminal of the PMOS transistor M62 receives the drive signal BP. The drain terminal of the NMOS transistor M64 is connected to the other end of the switch S64. The source terminal of the NMOS transistor M64 receives the reference voltage VSS. The gate terminal of the NMOS transistor M64 receives the drive signal BN.

When the control signal φ1 is set at high level, the control signal φ2 is set at low level. At this time, the switches S61 and S63 are set in the conductive state, and the output terminal O1 is driven with the low impedance. At the same time, the switches S62 and S64 are set in the non-conductive state, and the output terminal O2 is controlled in the high impedance state. The output circuit 20 is controlled in the non-operating state.

Similarly, when the control signal φ2 is set at high level, the control signal φ1 is set at low level. The output terminal O2 is driven with the low impedance. The output terminal O1 is controlled in the high impedance state, and the output terminal 10 is controlled in the non-operating state.

As described above, according to the first embodiment of the present invention, the power consumption can be reduced, and the influence of the crosstalk from the non-selected output circuit to the selected output circuit can be reduced.

To generally implement a switch by a semiconductor element, the two ends of the switch are often constituted by the drain and source terminals of a MOS transistor. The ON/OFF operation of the MOS transistor is controlled by a voltage supplied to the gate terminal, thereby functioning the MOS transistor as the switch. In a switch formed from a MOS transistor, when a voltage applied to the gate terminal is constant, the ON resistance value of the MOS transistor varies due to the voltage of a signal to be transmitted by the switch. In the switch formed from the MOS transistor, the variation in ON resistance value often adversely affects the distortion characteristics of the overall circuit. In each of the output circuits of the first to third arrangement examples (FIGS. 2, 4, and 5A to 5D), there is no switch connected in series to the output terminal and the transistor (driving element) for driving the output terminal. When a switch is formed from a semiconductor element, excellent distortion characteristic can be attained.

In each of the output circuits of the first and third arrangement examples (FIGS. 2 and 5A to 5D), there is no switch connected in series between the source terminal/drain terminal of the transistor forming the output terminal and the power supply voltage VDD/reference voltage VSS. When a large load current flows from the output terminal, heat loss caused by the ON resistance of the switch and the influence of the voltage effect can be suppressed.

Figure 7:
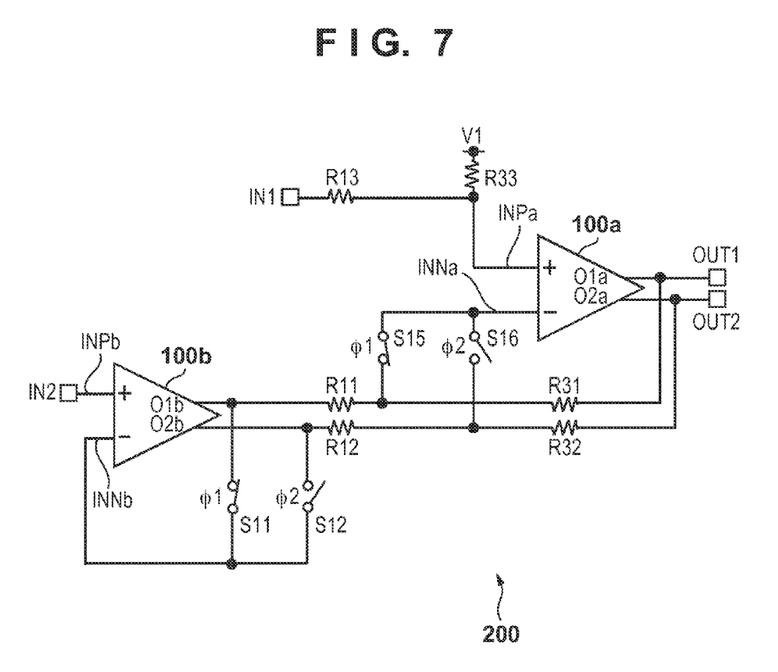
FIG. 7 is a circuit diagram showing the arrangement of an amplifier circuit according to the second embodiment.

FIG. 7 is a circuit diagram showing the arrangement of an amplifier circuit 200 according to the second embodiment of the present invention. The amplifier circuit 200 includes a first differential amplifier 100a and a second differential amplifier 100b. Each of the first differential amplifier 100a and the second differential amplifier 100b can be formed from the amplifier circuit 100 of the first embodiment. A non-inverting input terminal INPa, an inverting input terminal INNa, and a plurality of output terminals O1a and O2a of the first differential amplifier 100a correspond to the non-inverting input terminal INP, the inverting input terminal INN, and the plurality of output terminals O1 and O2 of the amplifier circuit 100 of the first embodiment, respectively. A non-inverting input terminal INPb, an inverting input terminal INNa, and a plurality of output terminals O1b and O2b of the second differential amplifier 100b correspond to the non-inverting input terminal INP, the inverting input terminal INN, and the plurality of output terminals O1 and O2 of the amplifier circuit 100 of the first embodiment, respectively.

To distinguish the components of the second differential amplifier 100b from those of the first differential amplifier 100a, a differential amplifier circuit 30, a plurality of output circuits 10 and 20, and a control circuit 40 of the second differential amplifier 100b will be referred to as the second differential amplifier circuit 30, the plurality of second output circuits 10 and 20, and the second control circuit 40.

The amplifier circuit 200 is arranged as a feedback amplifier circuit and, more specifically a negative feedback amplifier circuit. The amplifier circuit 200 includes input terminals IN1 and IN2 and outputs a signal obtained by amplifying a voltage between signals input to the input terminals IN1 and IN2 from a selected one of the plurality of output terminals OUT1 and OUT2.

One end of a resistor R13 is connected to the input terminal IN1. One end of a resistor R33 and the non-inverting input terminal (first input terminal) INPa of the first differential amplifier 100a are connected to the other end of the resistor R13. The other end of the resistor R33 receives a reference voltage V1. The non-inverting input terminal (third input terminal) INPb of the second differential amplifier 100b is connected to the input terminal IN2. A plurality of second switches S11 and S12 are connected between the inverting input terminal (fourth input terminal) INNb of the second differential amplifier 100b and the plurality of second output terminals O1b and O2b of the second differential amplifier 100b.

A plurality of feedback paths are formed between the plurality of output terminals O1a and O2a of the first differential amplifier 100a and the inverting input terminal (second input terminal) INNa of the first differential amplifier 100a. First switches S15 and S16 are arranged in the plurality of feedback paths, respectively. The first switch arranged in the feedback path between the inverting input terminal INNa and the output terminal of the selected one of the plurality of output circuits of the first differential amplifier 100a is set in the ON state. On the other hand, the first switch arranged in the feedback path between the inverting input terminal INNa and the output terminal of the non-selected one of the plurality of output circuits of the first differential amplifier 100a is set in the OFF state.

The one-ends of the plurality of first switches S15 and S16 are connected to the inverting input terminal INNa. The other-ends of the plurality of first switches S15 and S16 are connected to the plurality of output terminals O1a and O2a (the output terminals OUT1 and OUT2 of the amplifier circuit 200) of the first differential amplifier 100a via first resistors R31 and R32. The plurality of second output terminals O1b and O2b and the plurality of second switches S11 and S12 are connected to the other-ends of the plurality of first switches R31 and R32 via second resistors R11 and R12.

Second switches S11 and S12 connected via the second resistors R31 and R32 to the other-ends of the first switches S15 and S16 arranged in the feedback path between the inverting input terminal INNa and the output terminal of the selected one of the plurality of output circuits of the first differential amplifier 100a are set in the ON state. The second switches S11 and S12 connected via the second resistors R31 and R32 to the other-ends of the first switches S15 and S16 arranged in the feedback path between the inverting input terminal INNa and the output terminal of the non-selected one of the plurality of output circuits of the first differential amplifier 100a are set in the OFF state. Note that the resistors R11, R12, and R13 have the same resistance value R1, and the resistors R31, R32, and R33 have the same resistance value R3.

The impedance states of the respective output terminals of the first differential amplifier 100a and the second differential amplifier 100b are selectively controlled in accordance with control signals φ1 and φ2. When the control signal φ1 is set at high level, the control signal φ2 is set at low level. The output terminals O1a and O1b of the differential amplifiers are driven with the low impedance. The output terminals O2a and O2b are controlled in the high impedance state. Similarly, when the control signal φ2 is set at high level, the control signal φ1 is set at low level. The output terminals O2a and O2b are driven with the low impedance. The output terminals O1a and O1b are controlled in the high impedance state.

The ON/OFF operations of the switches S11, S15, S12, and S16 are controlled in accordance with the control signals φ1 and φ2. When the control signal φ1 is set at high level, the switches S11 and S15 are controlled in the conductive state. When the control signal φ1 is set at low level, the switches S11 and S15 are controlled in the non-conductive state. When the control signal φ2 is set at high level, the switches S12 and S16 are controlled in the conductive state. When the control signal φ2 is set at low level, the switches S12 and S16 are controlled in the non-conductive state.

A circuit operation when the control signal φ1 is set at high level and the control signal φ2 is set at low level will be described below. The second differential amplifier 100b outputs a signal equivalent to a signal input to the input terminal IN2 from the output terminal O1b driven with the low impedance. The first differential amplifier 100a outputs the following output voltage VOUT from the output terminal OUT1 connected to the output terminal O1a driven with the low impedance:

$$VOUT = (VIN1 - VIN2) \times R3/R1 + V1$$

In this case, the output terminal O2a of the first differential amplifier 100a and the output terminal O2b of the second differential amplifier 100b are set in the high impedance state. The switches S12 and S16 are set in the non-conductive state. The output terminal OUT2 is set in the high impedance state.

Similarly, when the control signal φ2 is set at high level and the control signal φ1 is set at low level, the output voltage VOUT described above is output from the output terminal OUT2, and the output terminal OUT1 is set in the high impedance state.

As described above, the impedance states of the plurality of output terminals OUT1 and OUT2 are controlled in the amplifier circuit 200 in FIG. 7. Therefore, the signal from the selected one of output terminals of the plurality of systems can be output using the common differential amplifier circuits 100a and 100b.

In the arrangement of the output circuits of the differential amplifiers 100a and 100b, a switch connected in series between the output terminal and the transistor for driving the output terminal is preferably absent, like in the first to third arrangements (FIGS. 2, 4, and 5A to 5D). In addition, a switch is preferably absent in the feedback path of the first differential amplifier 100. In this case, the change in ON resistance of the switch depending on the signal level does not occur. Therefore, no variation in signal caused by the negative feedback occurs, and excellent distortion characteristic can be obtained.

Figure 8:
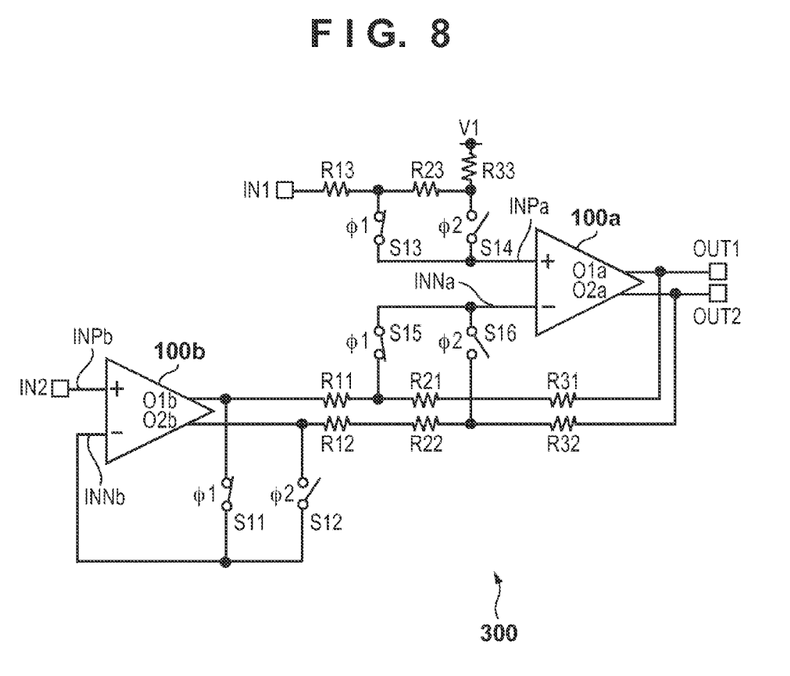
FIG. 8 is a circuit diagram showing the arrangement of an amplifier circuit according to the third embodiment.

FIG. 8 is a circuit diagram showing the arrangement of an amplifier circuit 300 according to the third embodiment of the present invention. The third embodiment is a modification of the amplifier circuit 200 of the second embodiment. In the amplifier circuit 300 of the third embodiment, signals amplified at different gains are output to output terminals (that is, a plurality of output terminals OUT1 and OUT2 of the amplifier circuit 300) of the plurality of output circuits of the differential amplifier 100a. The amplifier circuit 300 includes input terminals IN1 and IN2 and outputs, from the selected one of the plurality of output terminals OUT1 and OUT2, a signal obtained by amplifying a voltage between signals input to the input terminals IN1 and IN2.

One end of a resistor R13 is connected to the input terminal IN1. One end of a resistor R23 and one end of a switch S13 are connected to the other end of the resistor R13. One end of a resistor R33 and one end of a switch S14 are connected to the other end of the resistor R23. A non-inverting input terminal INPa of the first differential amplifier 100a is connected to the other end of the switch S13 and the other end of the switch S14. A resistor R21 is inserted in series between a resistor R31 and a connection node between a resistor R11 and a switch S15. A resistor R22 is inserted in series between a resistor R12 and a connection node between a resistor R32 and a switch S16. Note that the resistors R21, R22, and R23 have the same resistance value R2.

The ON/OFF operations of the switches S13 and S14 are controlled in accordance with control signals φ1 and φ2 input to the first differential amplifier 100a and a second differential amplifier 100b. That is, when the control signal φ1 is set at high level, the switch S13 is controlled in the conductive state. When the control signal φ1 is set at low level, the switch S13 is controlled in the non-conductive state. When the control signal φ2 is set at high level, the switch S14 is controlled in the conductive state. When the control signal φ2 is set at low level, the switch S14 is controlled in the non-conductive state.

An operation when the control signal φ1 is set at high level and the control signal φ2 is set at low level will be described below. In this case, the first differential amplifier 100a outputs the following output voltage VOUT from the output terminal OUT1 connected to the output terminal O1a driven with the low impedance.

$$VOUT = (VIN1 - VIN2) \times (R3+R2)/R1 + V1$$

In this case, an output terminal O2a of the first differential amplifier 100a and an output terminal O2b of the second differential amplifier 100b are set in the high impedance state, and the switches S12 and S16 are set in the non-conductive state. Therefore, the output terminal OUT2 is set in the high impedance state.

An operation when the control signal φ2 is set at high level and the control signal φ1 is set at low level will be described below. In this case, the first differential amplifier 100a outputs the following output voltage VOUT from the output terminal OUT2 connected to the output terminal O2a driven with the low impedance. The output VOUT has a gain different from the case in which the control signal φ1 is set at high level.

$$VOUT = (VIN1 - VIN2) \times R3/(R1+R2) + V1$$

The output terminal O1a of the first differential amplifier 100a and the output terminal O1b of the second differential amplifier 100b are set in the high impedance state, and the switches S11 and S15 are set in the non-conductive state. Therefore, the output terminal OUT1 is set in the high impedance state.

In the amplifier circuit 300 of the third embodiment shown in FIG. 8, the impedance states of the plurality of output terminals OUT1 and OUT2 are controlled. This makes it possible to output a signal from one of output terminals of the plurality of systems using the common differential amplifiers 100a and 100b. In addition, signals selectively output from the output terminals of the plurality of systems have different gains.

Figure 9A:
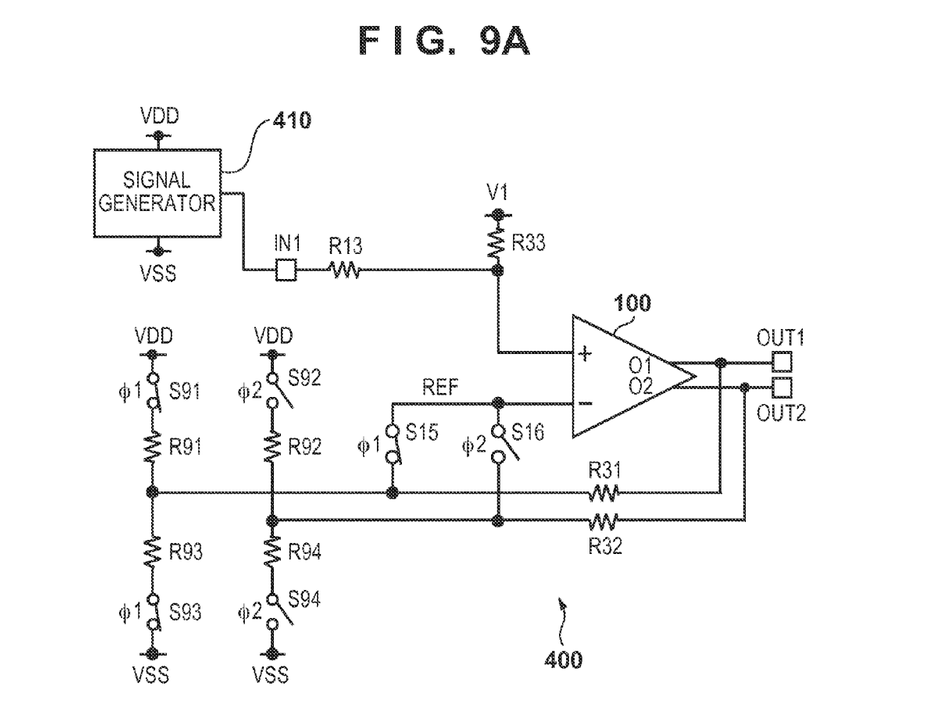
FIGS. 9A and 9B are a circuit diagram and a waveform chart of the arrangement of an amplifier circuit according to the fourth embodiment.

FIG. 9A is a circuit diagram showing the arrangement of an amplifier circuit 400 according to the fourth embodiment of the present invention. According to the fourth embodiment, in the amplifier circuit 400, signals amplified at different gains can be output to the output terminals (that is, a plurality of output terminals OUT1 and OUT2 of the amplifier circuit 400) of a plurality of output circuits of a differential amplifier circuit 100. The amplifier circuit 400 includes an input terminal IN1 and outputs, from the selected one of the output terminals OUT1 and OUT2, a signal obtained by amplifying a voltage between a reference signal REF and a signal input to the input terminal IN1.

In the fourth embodiment, the signal input to the input terminal IN1 has a correlation with a voltage between a power supply voltage VDD and a reference voltage VSS. The amplitude of the signal input to the input terminal IN1 varies depending on the variation of the power supply voltage. In this case, when the reference signal REF is set as a signal correlated with the voltage between the power supply voltage VDD and the reference voltage VSS, the variation of the power supply voltage can be canceled.

More specifically, when a signal generator 410 and a circuit connected to the inverting input terminal of the differential amplifier circuit 100 are connected to the common power supply voltage VDD and reference voltage VSS, the variation of the power supply voltage VDD can be canceled by the differential amplifier 100.

In the fourth embodiment, the differential amplifier circuit arranged on the inverting input terminal side and located in the amplifier circuit of each of the second and third embodiment need not be used. The fourth embodiment is advantageous in space saving and low power consumption.

Figure 9B:
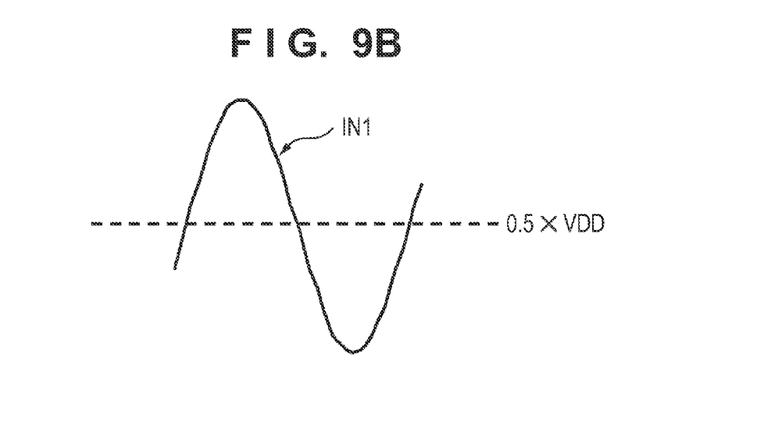

For example, when the center value of the amplitude of the signal input to the input terminal IN1 is 0.5×VDD, as shown in FIG. 9B, and the following conditions are held, $R91=R93=R92=R94=2\times R13$ $R31=R32=R33=R3$ $R13=R1$ the differential amplifier 100 outputs the following output voltage VOUT from the output terminal OUT1 connected to the output terminal O1 driven with the low impedance or from the output terminal OUT2 connected to the output terminal O2.

$VOUT=(VIN1-0.5\times VDD)\times R3/R1+V1$

In each embodiment described, a single-end output is employed as an output from an amplifier circuit, but may be changed to a differential output.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-226327, filed Oct. 11, 2012, which is hereby incorporated by reference herein in its entirety.

What is claimed is:

1. An amplifier circuit comprising:
    a differential amplifier circuit configured to amplify a voltage between a signal input to a first input terminal and a signal input to a second input terminal and output differential signals to differential signal lines;
    a plurality of output circuits configured to receive in common the differential signals via the differential signal lines and output, to independent output terminals, signals each corresponding to the differential signals; and
    a control circuit configured to set at least one of the plurality of output circuits in an operating state to drive an output terminal of the at least one of the plurality of output circuits, and set a different one of the plurality of output circuits in a non-operating state and set an output terminal of the different one of the plurality of output circuits in a high impedance state.

2. The circuit according to claim 1, wherein the plurality of output circuits do not consume power in the non-operating state.

3. The circuit according to claim 1, wherein
    each of the plurality of output circuits includes an output terminal and a driving element configured to drive the output terminal, and
    the control circuit causes a driving element of the at least one of the plurality of output circuits to operate in accordance with the differential signals and turns off a driving element of the remaining output circuit.

4. The circuit according to claim 3, wherein each of the plurality of output circuits does not include a switch between the output terminal of the output circuit and the driving element of the output circuit.

5. An amplifier circuit comprising:
    a differential amplifier circuit configured to amplify a voltage between a signal input to a first input terminal and a signal input to a second input terminal;
    a plurality of output circuits each configured to output a signal corresponding to a signal output from the differential amplifier circuit; and
    a control circuit configured to set at least one of the plurality of output circuits in an operating state to drive an output terminal of the at least one of the plurality of output circuits, and set a different one of the plurality of output circuits in a non-operating state and set an output terminal of the different one of the plurality of output circuits in a high impedance state,
    a plurality of feedback paths formed between the output terminals of the plurality of output circuits and the second input terminal, and a plurality of first switches arranged in the plurality of feedback paths, respectively,
    wherein the first switch arranged in the feedback path between the second input terminal and the output terminal of the at least one of the plurality of output circuits is set in an ON state, and the first switch arranged in the feedback path between the second input terminal and the output terminal of the different one of the plurality of output circuits is set in an OFF state.

6. The circuit according to claim 5, further comprising:
    a differential amplifier having a third input terminal, a fourth input terminal, and a plurality of second output terminals; and
    a plurality of second switches each having one-end respectively connected to one of the plurality of second output terminals and the other-end connected to the fourth input terminal,
    wherein one-ends of the plurality of first switches are connected to the second input terminal, and the other-ends of the plurality of first switches are connected to the output terminals of the plurality of output circuits via first resistors, the plurality of second output terminals and one-ends of the plurality of second switches are connected to the other-ends of the plurality of first switches via second resistors, and the second switch connected via the second resistor to the other-end of the first switch arranged in the feedback path between the second input terminal and the output terminal of the at least one of the plurality of output circuits is set in an ON state, and a remaining one of the second switches is set in an OFF state.

7. The circuit according to claim 6, wherein the differential amplifier comprises:
 a second differential amplifier circuit configured to amplify a voltage between a signal input to the third input terminal and a signal input to the fourth input terminal;
 a plurality of second output circuits configured to output a signal corresponding to a signal output from the second differential amplifier circuit to the plurality of second output terminals;
 a second control circuit configured to set at least one of the plurality of second output circuits in an operating state to drive an output terminal of the at least one of the plurality of second output circuits and set a different one of the plurality of second output circuits in a non-operating state and set an output terminal of the different one of the plurality of second output circuits in a high impedance state.

8. The circuit according to claim 7, wherein signals amplified at different gains are output to the output terminals of the plurality of output circuits.

* * * * *